United States Patent
Amako et al.

(10) Patent No.: US 11,670,741 B2
(45) Date of Patent: Jun. 6, 2023

(54) METHOD OF MANUFACTURING AN OPTOELECTRONIC DEVICE

(71) Applicants: Dow Silicones Corporation, Midland, MI (US); Rohm and Haas Electronic Materials LLC, Marlborough, MA (US); Dow Corning Toray Company, Ltd., Chiba (JP)

(72) Inventors: Masaaki Amako, Chiba (JP); Anna Ya Ching Feng, Taoyuan (TW); Fumito Nishida, Midland, MI (US)

(73) Assignees: Rohm and Haas Electronic Materials LLC, Marlborough, MA (US); DuPont Toray Specialty Materials Kabushiki Kaisha, Tokyo (JP); DDP Specialty Electronic Materials US 9, LLC, Wilmington, DE (US)

( * ) Notice: Subject to any disclaimer, the term of this patent is extended or adjusted under 35 U.S.C. 154(b) by 690 days.

(21) Appl. No.: 16/620,371

(22) PCT Filed: Jul. 13, 2018

(86) PCT No.: PCT/US2018/041960
§ 371 (c)(1),
(2) Date: Dec. 6, 2019

(87) PCT Pub. No.: WO2019/022964
PCT Pub. Date: Jan. 31, 2019

(65) Prior Publication Data
US 2020/0144459 A1  May 7, 2020

Related U.S. Application Data

(60) Provisional application No. 62/537,553, filed on Jul. 27, 2017.

(51) Int. Cl.
| | |
|---|---|
| *H01L 33/50* | (2010.01) |
| *H01L 51/56* | (2006.01) |
| *C09J 7/35* | (2018.01) |
| *C09J 7/10* | (2018.01) |
| *C09J 5/06* | (2006.01) |
| *C09J 11/04* | (2006.01) |

(52) U.S. Cl.
CPC .............. *H01L 33/502* (2013.01); *C09J 5/06* (2013.01); *C09J 7/10* (2018.01); *C09J 7/35* (2018.01); *C09J 11/04* (2013.01); *C09J 2203/326* (2013.01); *C09J 2301/416* (2020.08); *C09J 2483/00* (2013.01); *H01L 2933/0041* (2013.01)

(58) Field of Classification Search
CPC ................................................... H01L 33/502
See application file for complete search history.

(56) References Cited

U.S. PATENT DOCUMENTS

| | | | | |
|---|---|---|---|---|
| 6,949,389 B2* | 9/2005 | Pichler | ................. | H01L 51/5259 257/E21.243 |
| 8,124,185 B2* | 2/2012 | Yokoi | ................. | H01L 51/0007 427/340 |
| 8,367,436 B2* | 2/2013 | Kwack | ................. | H01L 51/5246 438/26 |
| 8,633,478 B2* | 1/2014 | Cummings | ........... | H01L 23/296 257/E51.001 |
| 9,219,015 B2 | 12/2015 | Kondo et al. | | |
| 9,269,873 B2 | 2/2016 | Imazu et al. | | |
| 10,424,703 B2 | 9/2019 | Ooyabu et al. | | |
| 10,553,820 B2* | 2/2020 | Li | ............................ | H01L 51/56 |
| 2005/0285520 A1* | 12/2005 | Cok | ....................... | H01L 51/529 313/512 |
| 2008/0276983 A1* | 11/2008 | Drake | ................. | H01L 31/02167 136/251 |
| 2009/0009577 A1* | 1/2009 | Nigam | ................. | B41M 7/0045 347/105 |
| 2011/0104506 A1* | 5/2011 | Behl | ........................ | C08L 83/00 428/447 |
| 2011/0185651 A1* | 8/2011 | Taylor | ..................... | H02S 20/23 52/173.3 |
| 2012/0067393 A1* | 3/2012 | Higashi | .................. | H02S 20/23 438/73 |
| 2012/0125436 A1* | 5/2012 | Cummings | ........... | H01L 31/048 165/185 |
| 2012/0198780 A1* | 8/2012 | Snowwhite | ................ | C09J 5/00 52/173.3 |
| 2012/0223455 A1* | 9/2012 | Shintani | .............. | H01L 31/0392 264/293 |
| 2013/0026503 A1* | 1/2013 | Son | ..................... | H01L 51/5243 438/34 |

(Continued)

FOREIGN PATENT DOCUMENTS

| | | |
|---|---|---|
| EP | 3273491 A1 | 1/2018 |
| JP | 2012079840 A | 4/2012 |

(Continued)

OTHER PUBLICATIONS

English language abstract and machine-assisted English translation for JP 2012-079840 A extracted from espacenet.com database on Feb. 22, 2021,14 pages.
English language abstract and machine-assisted English translation for JP 2013-004923 A extracted from espacenet.com database on Feb. 22, 2021, 34 pages.
English language abstract for JP 2016-517463 A extracted from espacenet.com database on Feb. 22, 2021, 1 page.
English language abstract and machine-assisted English translation for JP 2016-122690 A extracted from espacenet.com database on Feb. 22, 2021, 16 pages.

(Continued)

*Primary Examiner* — Caleb E Henry
(74) *Attorney, Agent, or Firm* — Howard & Howard Attorneys PLLC

(57) ABSTRACT

Disclosed is a method of making an optoelectronic device that incorporates a crosslinked resin-linear polyorganosiloxane.

12 Claims, No Drawings

(56) References Cited

U.S. PATENT DOCUMENTS

| | | | |
|---|---|---|---|
| 2013/0059105 A1* | 3/2013 | Wright | C09D 133/14 427/515 |
| 2013/0165602 A1 | 6/2013 | Horstman et al. | |
| 2013/0168727 A1 | 7/2013 | Horstman et al. | |
| 2013/0171354 A1 | 7/2013 | Horstman et al. | |
| 2013/0172496 A1 | 7/2013 | Horstman et al. | |
| 2013/0245187 A1 | 9/2013 | Swier et al. | |
| 2014/0008685 A1 | 1/2014 | Basin et al. | |
| 2014/0262002 A1* | 9/2014 | Suwa | C09J 7/29 156/60 |
| 2016/0009866 A1 | 1/2016 | Swier | |
| 2016/0032148 A1 | 2/2016 | Amako et al. | |
| 2016/0043348 A1* | 2/2016 | Zhang | H01L 27/3246 257/40 |
| 2016/0118555 A1 | 4/2016 | Swier et al. | |

FOREIGN PATENT DOCUMENTS

| | | | |
|---|---|---|---|
| JP | 2013004923 A | 1/2013 | |
| JP | 2014096491 A | 5/2014 | |
| JP | 2016517463 A | 6/2016 | |
| JP | 2016122690 A | 7/2016 | |
| JP | 2016174148 A | 9/2016 | |
| TW | 201239539 A | 10/2012 | |
| WO | 2007120197 A2 | 10/2007 | |
| WO | 2013137356 A1 | 9/2013 | |
| WO | 2015187909 A1 | 12/2015 | |
| WO | 2015200587 A1 | 12/2015 | |
| WO | 2016065016 A1 | 4/2016 | |
| WO | 2016148019 A1 | 9/2016 | |

OTHER PUBLICATIONS

English language abstract for WO 2013/137356 A1 extracted from espacenet.com database on Feb. 22, 2021, 2 pages.

English language abstract for WO 2016/148019 A1 extracted from espacenet.com database on Feb. 22, 2021, 1 page.

International Search Report for Application No. PCT/US2018/041960 dated Oct. 23, 2018, 3 pages.

English language abstract for JP 2016-174148 extracted from espacenet.com database on Dec. 18, 2019, 2 pages.

English language abstract for JP 2014-096491 A extracted from espacenet.com database on Mar. 10, 2021, 2 pages.

English language abstract for TW 20239539 A extracted from espacenet.com database on Jul. 25, 2022, 2 pages.

\* cited by examiner

METHOD OF MANUFACTURING AN OPTOELECTRONIC DEVICE

CROSS-REFERENCE TO RELATED APPLICATIONS

The present application is the National Stage of International Patent Application No. PCT/US2018/041960, filed on Jul. 13, 2018, which claims priority to and all the benefits of U.S. Provisional Patent Application No. 62/537,553, filed on Jul. 27, 2017, which are both hereby expressly incorporated herein by reference in their entirety.

The present invention generally relates to an improved method of manufacturing an optical device.

Increasingly, white light emitting LEDs ("white LEDs") are being used to replace conventional fluorescent, compact fluorescent and incandescent light sources in virtually all applications. LEDs generally include one or more photoluminescence materials (e.g., one or more phosphor materials), which absorb a portion of the radiation emitted by the LED and re-emit light of a different color (wavelength). Typically, the LED generates blue light and the phosphor(s) absorbs a percentage of the blue light and re-emits yellow, green, red, or a combination of green, yellow, and red light. The portion of the blue light generated by the LED that is not absorbed by the phosphor material combined with the light emitted by the phosphor provides light which appears to the eye as being white in color.

Commonly, white LEDs comprise one or more blue LED chips mounted within a cavity of a package which is then filled with an encapsulant containing the one or more phosphor material; a process called dispensing. A disadvantage of such white LEDs made by dispensing is challenge to tightly control the color characteristics of the final LED. Recently, attention has focused on producing white LEDs that enables better color control by applying phosphor directly to unpackaged LED chips.

LED chips are sometimes surrounded by a reflective material rather than being placed in a cavity. The reflective structure surrounds the LED chips on all 4 side with only the top emitting surface exposed. Such structures are commonly produced by dispensing or compression molding a liquid white material. A disadvantage of these processes are the difficulty in removing excess overmolded material to cleanly re-expose LEDs. Dispensing also faces challenges with achieving good control of thickness and surface uniformity and ability to penetrate narrow openings.

JP 2016174148 is one example describing an array of LEDs mounted on a substrate that attempts to solve the dispensing problems of the art. The cited reference, however, describes a process that requires a complete cure or an intermediate b-stage curing step prior to removing excess material covering the top surface of LED chips.

The present invention is an alternative improvement to the prior art by providing a method of manufacturing a LED wherein a curable hot melt is contacted with a filler material that is applied over a substrate to fill lateral space and fabricate sidewalls around an LED chip. A separate b-stage cure step of material is not necessary, and in fact is not preferred, in the present invention. This improvement in the production method will enable more efficient production of LEDs with improvement in adhesion between the sidewall and top wavelength conversion layer of the LED.

The present invention provides a method of manufacturing an optoelectronic device comprising providing a substrate wherein the substrate comprises one or more electro-optic component arranged on at least one surface of the substrate; contacting the surface of the electro-optic component parallel to the substrate with a lateral filler film comprising a filler and a curable silicone hot melt; contacting the lateral filler film with a release liner; and applying pressure to create the optoelectronic device.

Also provided is such a method further comprising application of a wavelength conversion layer and co-curing. Lastly, devices made by the process of the present invention and methods of using such devices are also provided.

Aspects of the invention are described herein using various common conventions. For example, all states of matter are determined at 25° C. and 101.3 kPa unless indicated otherwise. All % are by weight unless otherwise noted or indicated. All % values are, unless otherwise noted, based on total amount of solid components used to synthesize or make the composition, which adds up to 100%. Aspects of the invention are described herein using various chemical terms. The meanings of said terms correspond to their definitions promulgated by IUPAC unless otherwise defined herein. The term "IUPAC" refers to the International Union of Pure and Applied Chemistry. For convenience, certain chemical terms are defined.

The term "film" means a material that is restricted in one dimension. The restricted dimension may be characterized as "thickness."

The terms "remove," "removed," "removing," and "removal" mean to cause to physically move apart, and thus as a result is no longer in direct touching. The cause of physical removal herein is mechanical in nature and not by chemical means.

The term "substrate" means a physical support having at least one surface upon which another material may be hosted.

The term "LED" means a light emitting diode. "LEDs" means a plurality of light emitting diodes.

The term "array" means an arrangement of LEDs; typically on a substrate.

The term "PET" means polyethylene terephthalate.

The term "cure" or "cured" means heating or heated at elevated temperatures such that the mechanical properties of a material are changed to impart full mechanical integrity (i.e. crosslinking and hardening or toughening of the subject material). A material is considered uncured if it does not undergo crosslinking at elevated temperature.

The present invention provides a method of manufacturing an optoelectronic device comprising providing a substrate. Conventional substrates of the art that are suitable for the present invention include, for example, polymer (e.g. PET or polyimide substrates), insulated metal, and ceramic substrates and may or may not possess metal pattern. Arranged on at least one surface of the substrate is at least one electro-optic component. Conventional electro-optic components may be used in the present invention. One example of a suitable electro-optic component is an LED. When LEDs are the electro-optic component they may be arranged in an array; such array may or may not include a wire bond. It is envisioned that an LED array of the present invention would not have a wire bond to themselves. That is, the LED chips themselves are not wirebonded but there may be other components that are wirebonded (e.g., Zener diodes) so long as the wire height is equal or lower than the height of LED chip. The design of the LED array is in accordance with conventional designs of the art.

A lateral filler film comprising a filler and a curable hot melt is then contacted with the surface parallel to the surface where the electro-optic component is arranged and/or affixed to the substrate to create a lateral filler layer. Such lateral filler film is placed in intimate contact with the parallel surface of the LED by manual or automated placement of film over the LED array.

A lateral filler film may serve to impart variety of optical function such as light absorption or reflection. For the reflective lateral filler film, suitable fillers include, for example, BN, $TiO_x$, $SiO_2$, $Al_2O_3$, $Al(OH)_3$, $BaSO_4$, ZnO, and blends thereof.

Curable hot melts for employing in the lateral filler film are macromolecules or a collection of macromolecules of a crosslinkable resin-linear polyorganosiloxane that are crosslinked and reacted with catalyst and inhibitor. Resin-linear polyorganosiloxane macromolecules may be hydrosilylation cured resin-linear organosiloxane block copolymers (R-LOB Copolymers). R-LOB Copolymers have a different monomer arrangement than those of non-block copolymers such as statistical, random or alternating copolymers. R-LOB Copolymers may be diblock, triblock, or higher block copolymers. R-LOB Copolymers are composed of macromolecules that are characterized by distinct linear blocks and distinct resin blocks. The linear blocks typically contain mostly, substantially all, or all D-type organosiloxane units ($R_2SiO_{2/2}$)—, which are primarily bonded together to form bivalent straight chain polymeric segments (e.g., having from 10 to 400 units each), which bivalent straight chain polymeric segments are referred to herein as "linear blocks." The resin blocks contain a majority, substantially all, or all of T-type organosiloxane units or Q units, although typically they are T-type organosiloxane units ($RSiO_{3/2}$)—. Typically, if there are any Q units ($SiO_{4/2}$) in the R-LOB Copolymer, they are relatively small in number (less than 5 mol % of all units). (In addition, the R-LOB Copolymers may contain a relatively small number* of M-type organosiloxane units ($R_3SiO_{1/2}$)—, wherein R is hydrocarbyl; *typically less than 5 mol % M-type units.) The T-type organosiloxane units are primarily bonded to each other to form polyvalent branched chain polymeric segments, which are referred to herein as "non-linear blocks." Thus, the R-LOB Copolymers are composed of macromolecules wherein the linear blocks are bonded to the non-linear blocks. In solid forms of the R-LOB Copolymer, a significant number of these non-linear blocks may aggregate together to form nano-domains. The aggregated non-linear blocks of the R-LOB Copolymers may be referred to as hard domains and the linear blocks as soft domains. The R-LOB Copolymers may be characterized by higher glass transition temperatures (Tg) than those of non-block copolymers. These R-LOB Copolymers may be designed to contain a low molar amount of unsaturated aliphatic groups, which enable cross-linking of the copolymers in downstream industrial applications such as sealing or encapsulating (opto)electronic devices. Some embodiments of these R-LOB Copolymers further contain an additional type of reactive group, which enables the R-LOB Copolymers so functionalized to be used in dual-cure mechanisms. Some R-LOB Copolymers are of the nanophase-separated type, which comprise nano-sized domains of linear blocks predominantly comprised of D units and of resin blocks predominantly comprised of T units.

Resin-linear polyorganosiloxane macromolecules may comprise a hydrosilylation-cured resin-linear organosiloxane block copolymer comprising: 40 to 90 mole percent D-type units of the formula [$R^1_2SiO_{2/2}$], 10 to 60 mole percent T-type units of the formula [$R^2SiO_{3/2}$], 0.5 to 35 mole percent silanol groups [Si—OH]; wherein each $R^1$ and $R^2$ independently is a ($C_1$-$C_{30}$)hydrocarbyl that has 0 aliphatic unsaturated bond or a ($C_1$-$C_{30}$)hydrocarbyl which comprises at least 1 aliphatic unsaturated bond, wherein the resin-linear organosiloxane block copolymer comprises from 0.5 to 5 mole percent of the ($C_1$-$C_{30}$)hydrocarbyl comprising at least one aliphatic unsaturated bond; wherein the D-type units [$R^1_2SiO_{2/2}$] are arranged in linear blocks having an average of from 100 to 300 D-type units [$R^1_2SiO_{2/2}$] per linear block and the T-type units [$R^2SiO_{3/2}$] are arranged in non-linear blocks having a molecular weight of at least 500 grams per mole (g/mol), wherein at least 30 mole percent of the non-linear blocks are crosslinked with each other and wherein each linear block is linked to at least one non-linear block via a divalent linker comprising a D-type or T-type siloxane unit. The resin-linear organosiloxane block copolymer may have a weight average molecular weight (Mw) of at least 20,000 g/mol.

Any resin-linear organosiloxane block copolymer is contemplated, including R-LOB Copolymers that are known in the art. E.g., see US 2013/0165602 A1, US 2013/0168727 A1, US 2013/171354 A1, US 2013/0172496 A1, and US 2013/0245187 A1. Hydrosilyation curable resin-linear organosiloxane block copolymer is then blended with cross-linker and appropriate catalyst and may also contain other desirable additives to create a hydrosilylation curable resin-linear formulation. The phosphor film binder, Dow Corning LF-1201, commercially available from Dow Corning Toray, Chiba, and equivalent to Dow Corning LF-1113, is an example of such hydrosilylation curable resin-linear formulation.

The exposed surface of the lateral filler film is then contacted with a release liner by conventional means. Release liner is typically a polymer substrate with release (i.e. non-stick) characteristics and includes siliconized PET, ETFE, and Teflon, preferably siliconized PET. Pressure is applied to the release layer. Such pressure may be applied under vacuum. Lateral filler layers of the present invention may be applied such that they measure 10 to 1000 μm in thickness, preferably 25-500 μm, and more preferably 50-200 μm. Suitably, the thickness of the optically functional layers should be comparable but no more than the height of the LED measured from the substrate surface. Compositions should be adjusted to yield desired reflectivity as well as viscoselastic properties. Pressure is applied to the release liner. Prior to this application of pressure, advantageously, the lateral filler film is uncured. A laterally continuous layer of LED and lateral filler film results on the substrate surface with a release liner remaining on the portion of the exposed LED/lateral filler film that is parallel and non-connected to the substrate.

The release liner is then removed by peeling or another conventional means. Following removal of the release liner, residue of the lateral filler material often remains on the surface of LED chips. Advantageously, the present invention allows the excess lateral filler material residue on LED chips to be removed by a simple wiping process. Removal can be as simple as several gentle swipe using solvent moistened wipes or solvent coated tool. A variety of solvents may be used but isopropyl alcohol ("IPA"), heptane, and hexane are preferred. Mixture of solvents may also be feasible (e.g., small amount of acetone or propylpropionate in IPA). Other hydrocarbons such as benzene, toluene, and xylene also work and be used as a mixture but are not preferred as they may swell and/or impact the integrity of b-stage layer and also due to health and/or environmental hazards. Residual solvent levels are typically less than 500 ppm and preferably less than 100 ppm.

It is envisioned that additional layers/structures may be added to the optoelectronic device of the present invention.

An example may be a light absorbing matrix surrounding the LEDs to provide high contrast display arrangement. Such structure can be fabricated by applying a light absorbing lateral filler film to the optoelectronic device of the present invention repeating the process described in this invention. The process for opening the optoelectronic device for filling of carbon black loaded (light absorbing) lateral filler film is in accordance with conventional means, such as by channeling using thick dicing blade or dicing and remounting on secondary/alternative substrate.

Another example of an additional layers/structures that may be added to the optoelectronic device of the present invention, are wavelength conversion layers like those already described in the art such as phosphor containing color conversion layers and may be applied by methods known to art such as that described in WO2016/065016A1.

Optoelectric devices made by the process of the present invention have applicability in a variety of applications. For example, they may be used in illumination, automotive lighting, indicator lights, flash, and lighting devices on personal electronics.

The invention is further illustrated by, and an invention embodiment may include any combinations of features and limitations of, the non-limiting examples thereof that follow. Ambient temperature is about 23° C. unless indicated otherwise.

EXAMPLES

Resin Used

| Resin A: | |
|---|---|
| Dow Corning LF-1201 Phosphor Film Binder | Commercially available from Dow Corning Toray, Chiba, Japan and equivalent to LF-1113 available from the same supplier |
| Resin B: | |
| Dow Corning LF-1200 Phosphor Film Binder | Commercially available from Dow Corning Toray, Chiba, Japan and equivalent to LF-1112 available from the same supplier |

Lateral Filler Film Preparation

Example 1

53.4 g of Resin A, 5.39 g of Showa Denko boron nitride powder UHP-S1 (0.5 umD), and 2.86 g propylpropionate was added to a mixing container. These components were hand mixed for 2 minutes, followed by 1200 rpm/2 min/without vacuum using Thinky ARV-310 LED×2 times. The mixture was further mixed at 1200 rpm/30 sec/10 kPa (i.e., under vacuum) then 600 rpm/30 sec/5 kPa. The slurry was coated onto a siliconized PET using a flame applicator with 491 um gap, and heated to dry the film using an oven with temperature at 70° C. for 30 minutes. The resulting film was 197 um thick. The reflectivity at 450 nm was 81.6%, measured using Konica Minolta CM-5.

Example 2

34.7 g of Resin A, 17.3 g of Sakai Chem titania powder SX-3103 (0.2 umD), and 2.0 g propylpropionate was added to a mixing container. These components were mixed at 2000 rpm/2 min without vacuum using Thinky ARV-310×2 times. The mixture was further mixed at 2000 rpm/30 sec/10 kPa (i.e., under vacuum) then 800 rpm/30 sec/5 kPa. The slurry was coated on siliconized PET using a comma coater with 324 um gap, and heated to dry the film using 1.2 m oven with temperature gradually increasing from 60° C. to 100° C. The resulting film was 139 um thick. The reflectivity at 450 nm was 96.6%, measured using Konica Minolta CM-5.

Example 3

3.175 g of Momentive PT120P001 boron nitride (D50=12 um; D90=20 um) was added to 10 g of Resin A. Mixture was mixed three times in FlackTek DAC 150 VAC-P speed mixer for 30 sec at 2000 rpm with hand mixing between the first and the second mix. Additional mixing was done under vacuum (reaches below 200 mm Hg) at 1500 rpm for 60 sec. The resulting slurry was coated on siliconized PET (Mitsubishi Polyester 2SLKN) using table top automatic coater then dried at 70° C. for 60 min yielding 152 μm thick film.

Lateral Filler Film Lamination and Residue Removal Process

Example 4

Film material fabricated in Example 2 was placed on an array of LEDs with their chip height 150 μm. This stack was placed in Imoto Vacuum press IMC-4C05 with both upper and lower plates temperature set at 100° C. then covered with a sheet of fluorosiliconized PET (Takara incorporation FL2-01 #75). System was evacuated for 1 min during which the vacuum reached 0.04 kPa, then compress under vacuum for 60 sec applying 1 kN at device temperature 100° C. The resulting laminate having 152 μm thick total was removed from the press and release linear peeled showing LED arrays with thin residual white materials. Residue was removed by hand wipe using isopropyl alcohol (IPA) moistened clean room cloth exposing clean surface of LED chips filled with white reflector.

Example 5

Film material fabricated in Example 1 was first compressed at 50° C. to make 150 μm thick film. The obtained film was placed on an array of LEDs with their chip height 150 μm. This stack was placed in Imoto Vacuum press IMC-4C05 with the upper plate heated to 100° C., and lower plate kept lower than 30° C. using water circulation, then covered with a sheet of fluorosiliconized PET (Takara Incorporation, FL2-01 #75). System was evacuated for 1 min during which the vacuum reached 0.04 kPa, then compress under vacuum for 60 sec applying 1 kN at device temperature 72° C. The resulting laminate having 151 μm thick total was removed from the press and release linear peeled showing LED arrays with thin residual white materials. Residue was removed by hand wipe using isopropyl alcohol (IPA) moistened clean room cloth exposing clean surface of LED chips filled with white reflector.

Comparable Example 1

Film material fabricated in Example 1, with 197 μm thick was placed on an array of LEDs with their chip height 150 μm. This stack was placed in Imoto Vacuum press IMC-4C05 with the upper plate heated to 100° C., and lower plate kept lower than 30° C. using water circulation, then covered with a sheet of fluorosiliconized PET (Takara Incorporation, FL2-01 #75). System was evacuated for 1 min during which the vacuum reached 0.04 kPa, then compress under vacuum for 60 sec applying 1 kN at device temperature 72° C. The resulting laminate having 187 μm thick total was removed from the press and release linear peeled showing LED arrays with thin residual white materials. The residue with 47 μm thick was not able to be removed by hand wipe using isopropyl alcohol (IPA) moistened clean room cloth exposing clean surface of LED chips.

Therefore, either compressing the material to the close height of the LED chip under higher temperatures or higher pressures, or the original film thickness should be close to the LED heights.

Example 6

Film material fabricated in Example 3 was placed on an array of LEDs. This stack was placed on a sample holder for a vacuum laminator (in-house custom made tool) with hot plate temperature set at 140° C. LED array/white film stack was covered with a sheet of siliconized PET (Mitsubishi Polyester 2SLKN) then placed a small piece of aluminum block (about 5 cm×5 cm×1 cm) and a plate (3"×5"×¼") with a total weight of 316 g on the film. The laminator was evacuated for 60 sec during which the vacuum reached about 28.5" Hg while the sample stayed raised above the hot plate by about a mm. Bladder was used to press the aluminum block/plate which in turn pushed the entire LED substrate/film/liner assembly on to the hot plate heating the substrate/white film stack for 30 sec. Pressure differential in chamber above and below bladder was about 10" Hg. The resulting sample showed very thin layer of residual material covering the surface of LED chips which could be removed with several wipes using heptane moistened cleanroom wipe.

Adhesion Between Lateral Filler Film (BN Film) and Wavelength Conversion Layer (Phosphor Film):

Example 7

30.407 g of NYAG-4454S (Intematix) and 0.751 g of propylpropionate was added to 18 g of Resin B. Mixture was mixed three times in FlackTek DAC 150 VAC-P speed mixer for 30 sec at 2000 rpm with hand mixing between the first and the second mix. Additional mixing was done under vacuum (reaches below 200 mm Hg) at 1500 rpm for 60 sec. The resulting slurry was coated on siliconized PET (Mitsubishi Polyester 2SLKN) using table top automatic coater then dried at 70° C. for 60 min yielding 50 am thick phosphor film.

6.984 g of boron nitride (BN)(PCTP2; Saint Goban) and 2.40 g of propylpropionate was added to 22 g of Resin A. Mixture was mixed three times in FlackTek DAC 150 VAC-P speed mixer for 30 sec at 2000 rpm with hand mixing between the first and the second mix. Additional mixing was done under vacuum (reaches below 200 mm Hg) at 1500 rpm for 60 sec. The resulting slurry was coated on siliconized PET (Mitsubishi Polyester 2SLKN) using table top automatic coater then dried at 90° C. for 90 min yielding 150 μm thick BN film.

Phosphor film and BN film were each cut to 1"×1" sheets and laminated on to separate aluminum plates (1×25×75 mm). 4 aluminate plates laminated with BN film were cured at 160° C. for 1 hour to obtained "cured BN film" (5 were left uncured). Al plates with uncured phosphor films were assembled with Al plates with BN films such that phosphor film and BN film overlapped completely and held together with a pair of clips. These assemblies were cured 16 hrs. at 160° C. to fabricate a lap shear test specimens. Test specimens were pulled on Instron Model 5566 at 2 in/min to measure tensile strength. Adhesion failure modes were also noted and summarized in Table 1. Precured BN film specimens (i.e., uncured phosphor film+cured BN film) measured lower tensile strength and all showed adhesive failure between the two films. When BN and phosphor films are cured simultaneously (i.e., uncured phosphor film+uncured BN film), tensile strength was higher and failure occurred either cohesively or adhesive failure between the phosphor film and the substrate (i.e., no adhesive failure between the two films) thereby indicating improvement in adhesion between the two layers.

TABLE 1

| Film | | Tensile Strength (psi) | | | typical % adhesive |
|---|---|---|---|---|---|
| BN | Phosphor | n | Avg | StdDev | failure btw films |
| Cured | Uncured | 4 | 673 | 61 | 90 |
| Uncured | Uncured | 5 | 1000 | 19 | 0 |

Adhesion of Lateral Filler Film (TiO$_2$ White Film) and Wavelength-Conversion Layer (Phosphor Film) Measured Through Die Shear Test Example 8

5.487 g of TiO$_2$ (SX-3103; Sakai Chem) and 1.01 g of propylpropionate was added to 10.91 g of Resin B. Mixture was hand mixed for 2 minutes, followed by 1200 rpm/2 min without vacuum using Thinky ARV-310LED×2 times. The mixture was further mixed at 1200 rpm/30 sec/10 kPa (i.e., under vacuum) then 600 rpm/30 sec/5 kPa. The resulting slurry was casted on Al plate (1×25×75 mm) with Teflon PSA dam (180 μm thickness). 90 μm thick uncured TiO$_2$ layer was obtained by drying 30 min at 70° C. (#4225 Uncured). 90 μm thick cured TiO$_2$ layer was obtained by drying 30 min at 70° C. followed by heating at 120° C. for 1 hr. then 160° C. for 2 hr. (#4225 Cured).

33.303 g of TiO$_2$ (SX-3103; Sakai Chem) and 5.04 g of propylpropionate was added to 10.78 g of Resin A. Mixture was hand mixed for 2 minutes, followed by 1200 rpm/2 min/without vacuum using Thinky ARV-310LED×2 times. The mixture was further mixed at 1200 rpm/30 sec/10 kPa (i.e., under vacuum) then 600 rpm/30 sec/5 kPa. The resulting slurry was casted on Al plate (1×25×75 mm) with Teflon PSA dam (180 um thickness). 90 μm thick uncured TiO$_2$ layer was obtained by drying 30 min at 70° C. (#4226 Uncured). 90 μm thick cured TiO$_2$ layer was obtained by drying 30 min at 70° C. followed by heating at 120° C. for 1 hr. then 160° C. for 2 hr. (#4226 Cured).

5.323 g of NYAG-4454L (Intematix, YAG phosphor, 13 μm diameter) and 1.01 g of propylpropionate was added to 10.88 g of Resin B. Mixture was hand mixed for 2 minutes, followed by 1200 rpm/2 min/without vacuum using Thinky ARV-310LED×2 times. The mixture was further mixed at 1200 rpm/30 sec/10 kPa (i.e., under vacuum) then 600 rpm/30 sec/5 kPa. The slurry was coated on siliconized PET using 750 um gap, followed by 70° C. for 2 hours to prepare 290 μm thick film (#4227).

8 mm diameter 290 umT #4227 phosphor film was punched out and placed on respective TiO$_2$ layer. 1×10×10 mm Al chips were then placed on the phosphor film making Al chip/Phosphor film/TiO$_2$ layer/Al plate structure. Another set was made by placing phosphor film directly on the aluminum plate then Al chip (i.e., without TiO$_2$ layer: Al/Phosphor film/Al plate). All samples were cured at 120° C./1 hr+160° C./2 hr. Al chips were sheared to measured die shear strength and the result showed improved adhesion strength when TiO$_2$ layer is present and more so when TiO$_2$ and phosphor layers were cured together (i.e., when TiO$_2$ layer was uncured prior to cure of the entire assembly).

TABLE 2

Die Shear Test structure

| | Al chip 4227 4225(un-cured) Al plate | Al chip 4227 4226(un-cured) Al plate | Al chip 4227 4225(cured) Al plate | Al chip 4227 4226(cured) Al plate | Al chip 4227 Al plate |
|---|---|---|---|---|---|
| (Avg. Force) (kg) | 25.68 | 28.29 | 23.74 | 27.49 | 11.1 |
| (Strength) N/cm$^2$ | 404 | 445 | 373 | 432 | 175 |

What is claimed is:

1. A method of manufacturing an optoelectronic device comprising:
   i) providing a substrate wherein the substrate comprises one or more electro-optic component arranged on at least one surface of the substrate;
   ii) contacting the surface of the electro-optic component parallel to the substrate with a lateral filler film comprising a filler and a curable silicone hot melt;
   iii) contacting the lateral filler film with a release liner; and
   iv) applying pressure to the lateral filler film, and
   v) removing a residue that is formed on the top surface of the electro-optic component, to create the optoelectronic device.

2. The method of claim 1 wherein the electro-optic component is a light emitting diode.

3. The method of claim 1 wherein the curable silicone hot melt is a crosslinkable resin-linear polyorganosiloxane formulation.

4. The method of claim 1 wherein the lateral filler film is uncured prior to applying pressure.

5. The method of claim 1 wherein the filler comprises a compound selected from the group consisting of TiO$_2$, BN, SiO$_2$, Al$_2$O$_3$, ZnO, BaSO$_4$, and mixtures thereof.

6. The method of claim 1 wherein the residue is removed by wiping with a solvent.

7. The method of claim 1 wherein the solvent comprises isopropyl alcohol, acetone, heptane, octane, propylpropionate, toluene, and mixtures thereof.

8. An optoelectronic device manufactured by the method of claim 1.

9. The method of claim 1 wherein the electro-optic component is an LED chip, and wherein after pressure is applied, a residue is formed on the top surface of the LED chip and is further removed.

10. The method of claim 1 wherein the thickness of the lateral filler film is arranged to the same or less as the height of the electro-optic component from the surface of the substrate prior to contacting it to the surface of the electro-optic component.

11. A method of manufacturing an optoelectronic device comprising:
    i) providing a substrate wherein the substrate comprises one or more electro-optic component arranged on at least one surface of the substrate,
    ii) contacting the surface of the electro-optic component parallel to the substrate with a lateral filler film comprising a filler and a curable silicone hot melt;
    iii) contacting the lateral filler film with a release liner;
    iv) applying pressure to create the optoelectronic device;
    v) applying a wavelength conversion layer on top of the created optoelectronic device; and
    vi) curing simultaneously.

12. An optoelectronic device manufactured by the method of claim 11.

* * * * *